United States Patent [19]
Christopherson et al.

[11] Patent Number: 5,754,566
[45] Date of Patent: May 19, 1998

[54] METHOD AND APPARATUS FOR CORRECTING A MULTILEVEL CELL MEMORY BY USING INTERLEAVING

[75] Inventors: Mark J. Christopherson, Folsom; Mark E. Bauer, Cameron Park, both of Calif.

[73] Assignee: Intel Corporation, Santa Clara, Calif.

[21] Appl. No.: 708,212

[22] Filed: Sep. 6, 1996

[51] Int. Cl.$^6$ .................................................. G11C 29/00
[52] U.S. Cl. ............................................................ 371/40.18
[58] Field of Search ........................................... 371/40.18

[56] References Cited

U.S. PATENT DOCUMENTS

| | | | |
|---|---|---|---|
| 4,661,929 | 4/1987 | Aoki et al. | 365/189 |
| 5,095,344 | 3/1992 | Harari | 357/23.5 |
| 5,450,363 | 9/1995 | Christopherson et al. | 365/205 |
| 5,475,693 | 12/1995 | Christopherson et al. | 371/10.2 |

OTHER PUBLICATIONS

Jack K. Wolf, "On Codes Derivable from the Tensor Product of Check Matrices", Apr., 1965, IEEE Transactions On Information Theory, pp. 281–284.

J.K. Wolf, B. Elspas, "Error–Locating Codes—A New Concept in Error Control", Apr., 1963, IEEE Transactions on Information Theory, pp. 113–117.

Nitin H. Vaidya, Dhiraj K. Pradhan, "A New Class of Bit– and Byte–Error Control Codes", Sep., 1992, IEEE Transactions on Information Theory, vol. 38, No. 5, pp. 1617–1623.

Douglas C. Bossen, et al., "Measurement and Generation of Error Correcting Codes for Package Failures", Mar., 1978, IEEE Transactions on Computers, vol. C–27, No. 3, pp. 201–204.

Eiji Fujiwara, et al., "A Class of Error–Locating Codes for Byte–Organized Memory Systems", Nov., 1994, IEEE Transactions on Information Theory, vol. 40, No. 6, pp. 1857–1865.

*Primary Examiner*—Stephen M. Baker
*Attorney, Agent, or Firm*—Blakely, Sokoloff, Taylor & Zafman

[57] ABSTRACT

A method and apparatus for correcting errors in a multilevel cell memory is described. A multilevel cell memory is comprised of multilevel cells, each capable of storing two or more bits of data. A plurality of data bits is received by the multilevel cell memory. The plurality of data bits are sorted into two or more data words. Error correction codes are generated for each of the two or more data words. A memory element bit pattern is formed that comprises one bit from each of the two or more data words. A charge state associated with the memory element bit pattern is stored in one of the multilevel cells.

23 Claims, 11 Drawing Sheets

METHOD AND APPARATUS FOR CORRECTING A MULTILEVEL CELL MEMORY BY USING INTERLEAVING

FIELD OF THE INVENTION

The present invention relates to the field of memory devices. More particularly, this invention relates to correcting an error in a multilevel cell memory device.

BACKGROUND OF THE INVENTION

A multilevel cell memory device is comprised of multilevel cells, each of which is able to store multiple charge states, or levels. Each of the charge states is associated with a memory element bit pattern.

FIG. 1 shows a representation of the charge states that can be stored in a prior art multilevel cell. FIG. 1 shows a multilevel cell capable of storing four charge states: levels 3–0. The charge states decrease in the amount of charge stored going from level 3 down to level 0.

Within a multilevel cell memory array, the multilevel cells maintaining a given charge state will have a distribution of voltage levels within a voltage range associated with that charge state. Various voltage regions separate the charge states from one another. A voltage region $V_{23}$ separates level 2 and level 3. A voltage region $V_{12}$ separates level 1 and level 2, and a voltage region $V_{01}$ separates level 0 and level 1.

In determining the amount of charge stored in a multilevel cell, the voltage maintained in the multilevel cell is compared against various reference voltages. Vref2 falls within voltage region $V_{23}$ and is used to separate level 3 from level 2. Thus, for example, if a multilevel cell maintains a voltage above Vref2, then it is at the charge state of level 3. Vref1 falls within voltage region $V_2$ and is used to separate level 2 from level 1. If the multilevel cell maintains a voltage level which is higher than Vref1 but lower than Vref2, the multilevel cell maintains the charge state of level 2. Vref0 falls within voltage region $Vo_{01}$ and is used to separate level 1 from level 0.

Each charge state has an associated memory element bit pattern. For one implementation, the memory element bit pattern '00' is associated with level 3, the memory element bit pattern '10' is associated with level 2, the memory element bit pattern '01' is associated with level 1, and the memory element bit pattern '11' is associated with level 0.

A multilevel cell memory is able to store two or more bits of data dependent upon the number of charge states that it can store. For example, a multilevel cell memory that can store four charge states can store two bits of data; a multilevel cell memory that can store eight charge states can store three bits of data; a multilevel cell memory that can store sixteen charge states can store four bits of data. For each of the n-bit multilevel cell memories, various memory element bit patterns can be implemented to be associated with each of the different charge states.

One example of a multilevel cell memory is described in U.S. Pat. No. 5,450,363, entitled "Gray Coding for a Multilevel Cell Memory System," by Christopherson et al., and issued to the common assignee of this application. The '363 patent describes one implementation of a multilevel cell memory. Multilevel cell memories can be used in Dynamic Random Access Memory (DRAM) and various types of Read-Only Memory (ROM), such as an Erasable Programmable Read-Only Memory (EPROM), an Electrically Erasable Programmable Read-Only Memory (EEPROM), and flash Erasable Programmable Read-Only Memory (flash EPROM).

FIG. 2 shows a prior art representation of a processor 100 and multilevel cell memory device 104. A processor 100 is coupled to a bus 102 and the memory device 104. The memory device 104 contains an interface controller 105 and a multilevel cell memory array 150. The processor 100 is coupled via the bus 102 to the interface controller 105. The processor 100 is also coupled via the bus 102 to the multilevel cell memory array 150. The interface controller 105 provides the necessary operations to control the multilevel cell memory array 150. For one embodiment, the interface controller 105 and multilevel cell memory array 150 are located on a single integrated circuit die.

Error correction Codes

In the prior art, data words stored in a memory array are processed through an encoder to generate error correction codes. The error correction codes are stored such that they can be retrieved with their associated data word. When the data words are retrieved from the memory array, error decoding circuitry uses the previously-saved error correction codes associated with the data words for locating, detecting, and/or correcting errors found in the data words as read from the memory array, as is well-known in the prior art.

There are different types of error correction codes. One common error correction code is a Hamming code. A Hamming code is useful for correcting a single bit error in a data word. A Hamming code can also detect double bit errors in a data word, but it cannot correct double bit errors.

Some error correction codes are able to determine which bit of a data word is incorrect. Some error correction codes can correct multiple bit errors. Detection codes, on the other hand, detect whether an error occurred, but cannot correct the error. Generally, the stricter the requirement for locating, detecting and correcting errors, the more bits of error correction code are required. Each bit of an error correction code, though, adds to the size and, thus, to the cost of the memory array. It is desirable to minimize the number of bits of an error correction code used to correct errors in a memory device.

SUMMARY OF THE INVENTION

A method and apparatus for correcting errors in a multilevel cell memory is described. A multilevel cell memory is comprised of multilevel cells, each capable of storing two or more bits of data. A plurality of data bits is received by the multilevel cell memory. The plurality of data bits are sorted into two or more data words. Error correction codes are generated for each of the two or more data words. A memory element bit pattern is formed that comprises one bit from each of the two or more data words. A charge state associated with the memory element bit pattern is stored in one of the multilevel cells.

Other features and advantages of the present invention will be apparent from the accompanying drawings and from the detailed description that follows below.

BRIEF DESCRIPTION OF THE DRAWINGS

FIG. 11 shows circuitry for encoding. FIG. 12 shows circuitry for decoding. FIG. 13 shows circuitry for both encoding and decoding.

DETAILED DESCRIPTION

A method and apparatus for correcting errors in a multilevel cell memory is described.

The applicants have observed that in a multilevel cell memory array, it is more likely that a single multilevel cell will be erroneous by two or more bits than it is for two multilevel cells to each be erroneous by a single bit. In order to capitalize on this observation, an interleave controller is used to separate the memory element bit patterns associated with each multilevel cell into multiple data words. Each data word comprises only one bit from the memory element bit pattern associated with a given multilevel cell, and each data word has its own error correction code associated with it. In this manner, a multiple bit error in a single multilevel cell is converted into multiple single-bit errors in multiple data words, each of which can be corrected with the error correction code associated with the multiple data words.

Figure 3:
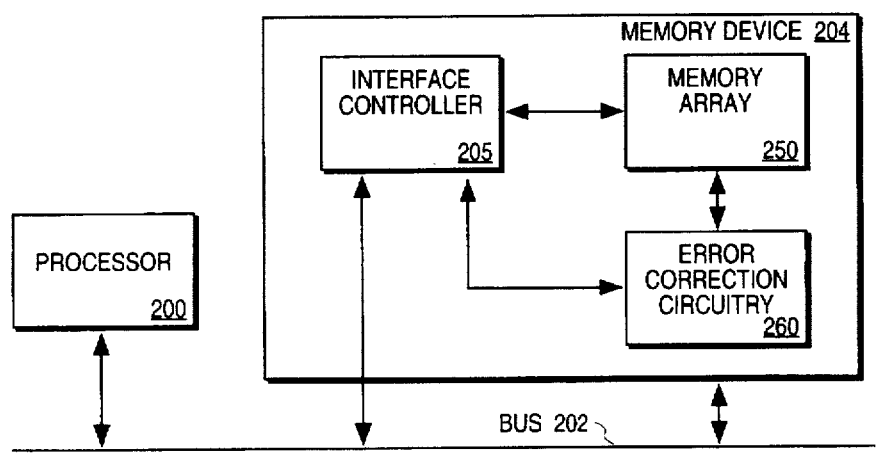
FIG. 3 shows a representation of a processor and multilevel cell memory device.

FIG. 3 shows a representation of a processor 200 and multilevel cell memory device 204. The processor 200 is coupled to a bus 202. The multilevel cell memory device 204 comprises an interface controller 205, a multilevel cell memory array 250, and error correction circuitry 260. The interface controller 205 is coupled to provide the necessary operations to control the multilevel cell memory array 250 and the error correction circuitry 260. Both the interface controller 205 and the error correction circuitry 260 are coupled to the bus 202. The multilevel cell memory array 250 is coupled to the error correction circuitry 260. The processor 200 writes data to the memory device 204 and reads data from the memory device 204.

Figure 4:
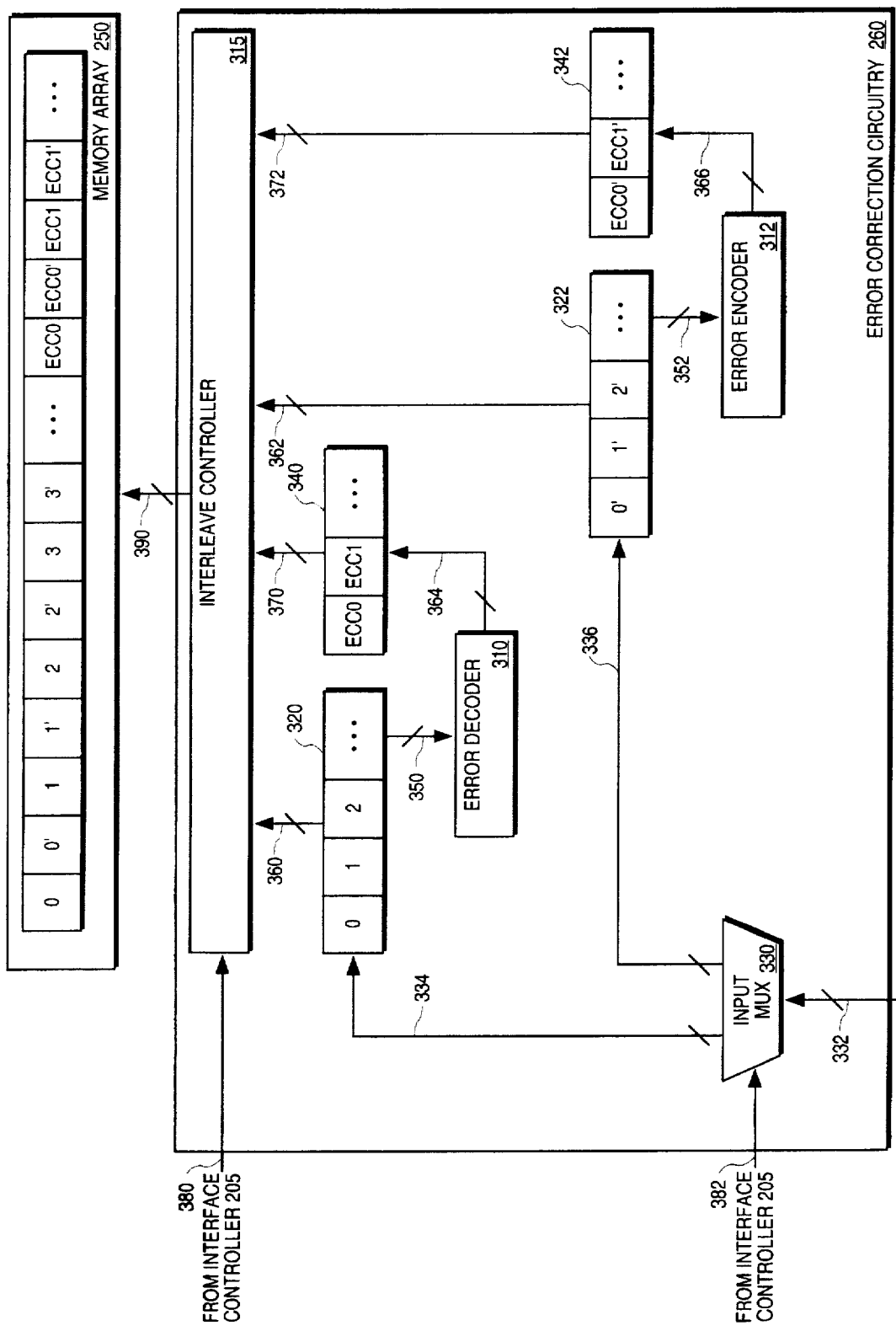
FIG. 4 shows a representation of the error encoding circuitry of a 2-bit multilevel cell configuration.

FIG. 4 shows a representation of the error encoding circuitry of a 2-bit multilevel cell configuration. Error correction circuitry 260 comprises error encoders 310 and 312, interleave controller (or interleavor) 315, data buffers 320 and 322, input multiplexer (mux) 330, and error code buffers 340 and 342.

The input mux 330 is coupled to the bus 202 via bus 332. The input mux 330 is coupled to each of the data buffers 320 and 322 via buses 334 and 336. Data buffers 320 and 322 are coupled to provide data to the error encoders 310 and 312 via buses 350 and 352. Data buffers 320 and 322 are coupled to provide data to the interleave controller 315 via buses 360 and 362. The error encoders 310 and 312 are coupled to the error code buffers 340 and 342 via buses 364 and 366. The error code buffers 340 and 342 are coupled to the interleave controller 315 via buses 370 and 372. The interleave controller 315 is coupled to the memory array 250 via bus 390.

The interleave controller 315 and the input mux 330 receive control signals 380 and 382 originating from the interface controller 205. The control signal 382 controls whether bus 202 is coupled to provide data to data buffer 320 or to data buffer 322. The control signal 380 controls the routing of data bits from the data buffers 320 and 322 and the error code buffers 340 and 342 to the memory array 250.

The memory array 250 is shown with representative 2-bit multilevel cells that interleave the data from the data buffers 320 and 322. For example, a first multilevel cell holds a voltage that is associated with a memory element bit pattern comprised of bits 0 and 0' from the data buffers 320 and 322. A subsequent multilevel cell holds a voltage that is associated with a memory element bit pattern comprised of bits 1 and 1' from the data buffers 320 and 322, and so forth.

For one embodiment, the error correction codes are also interleaved such that a multilevel cell holds a voltage associated with a memory element bit pattern comprised of ECC0 and ECC0'. Another multilevel cell holds a voltage associated with a memory element bit pattern comprised of ECC1 and ECC1', and so forth.

In another embodiment, the error correction codes are stored in a separate memory array from that of the data, and may or may not be interleaved.

Figure 6:
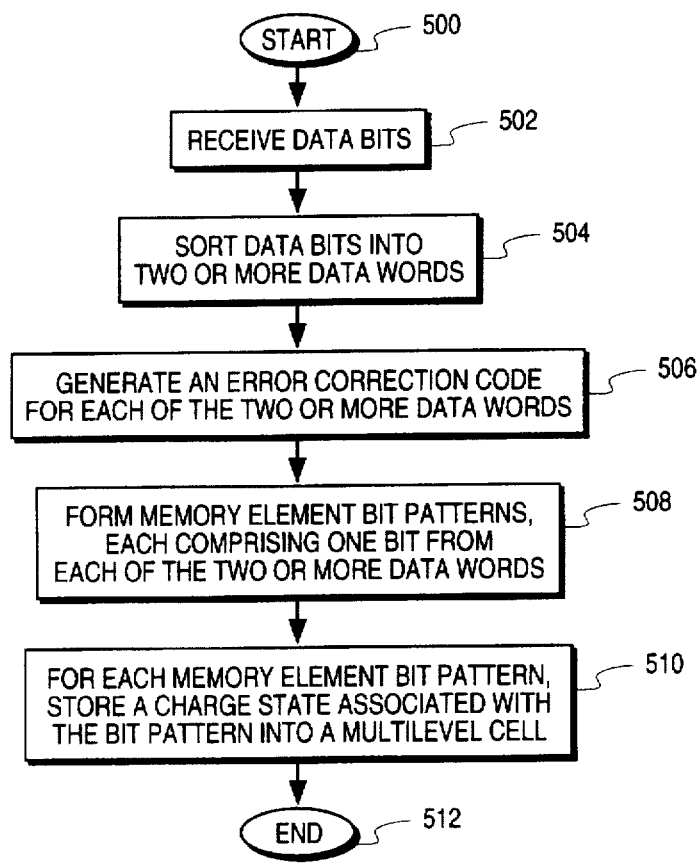
FIG. 6 is a flowchart showing the steps taken when data bits are written to the multilevel cell memory.

FIG. 6 is a flowchart showing the steps taken when data bits are written to the multilevel cell memory. The flowchart starts at block 500, from which operation continues at block 502. At block 502, data bits are received by the multilevel cell memory via bus 332 and the input mux 330. At block 504, the data bits are sorted into two or more data words. For the 2-bit multilevel cell of FIG. 4, the data bits are sorted into two data words, and each data word is stored in one of the data buffers 320 and 322. In an alternate embodiment, however, it is possible for combinatorial logic to be used to generate error codes dynamically such that the data buffers can be eliminated, as will be described with respect to FIGS. 11–13.

Operation continues at block 506, at which error correction codes are generated for each of the two or more data words. The error correction codes may be provided directly to the interleave controller 315, or they may be temporarily held in error code buffers such as 340 and 342, as shown in FIG. 4. Although the number of bits of error correction code vary dependent upon the implementation, for one embodiment, the data buffer 320 includes 64 bits of data (0,1,2, . . . , 63), and the error code buffer 340 includes 8 bits of error correction code (ECC0, ECC1, . . . , ECC7). For this embodiment, the data buffer 322 also includes 64 bits of data (0', 1', 2', . . . , 63') and the error code buffer 342 includes 8 bits of error correction code (ECC0', ECC1', . . . , ECC7').

At block 508, the data bits from the two or more data words and the error correction codes from the error code buffers are provided to an interleave controller which forms memory element bit patterns, each of which comprise one bit from each of the two or more data words. At block 510, for each of the memory element bit patterns, a charge state associated with the memory element bit pattern is stored into a multilevel cell. The flowchart terminates at block 512.

Figure 5:
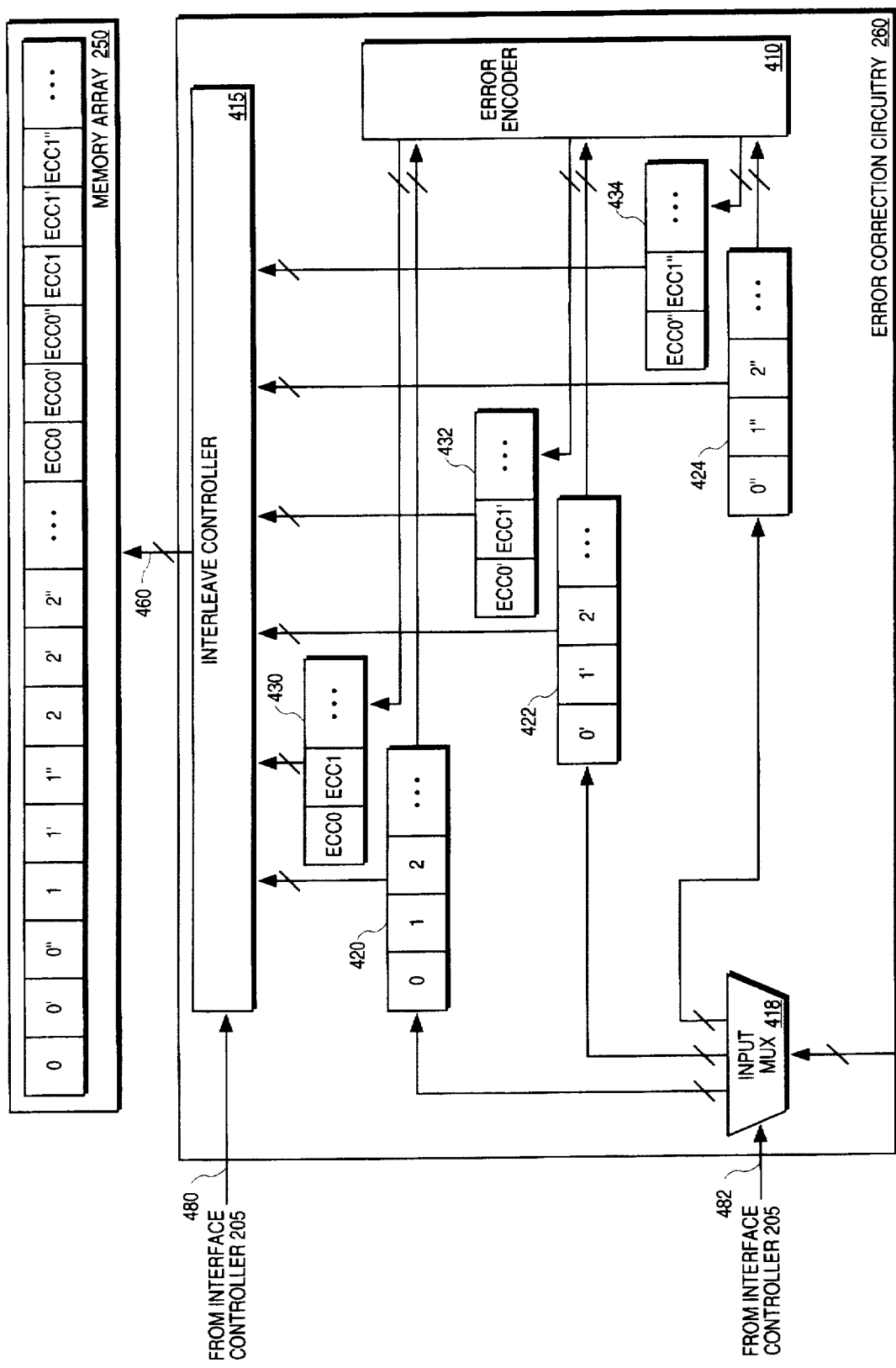
FIG. 5 shows a representation of the error encoding circuitry of the error correction circuitry and corresponding memory array for a 3-bit multilevel cell configuration.

FIG. 5 shows a representation of the error encoding circuitry of the error correction circuitry 260 and corresponding memory array 250 for a 3-bit multilevel cell configuration. The error correction circuitry comprises error encoder 410, interleave controller 415, an input multiplexer (mux) 418, data buffers 420, 422, and 424, and error code buffers 430, 432, and 434.

The error correction circuitry works substantially similar to that of FIG. 4. A third data buffer 424 and a third error code buffer 434 are used to hold a third set of data which is used as one of the bits of the 3-bit memory element bit patterns stored to the multilevel cell memory array 250. The interleave controller 415 interleaves the inputs from the data buffers 420, 422, and 424, and the error code buffers 430, 432, and 434 to provide data to the memory array 250.

FIG. 5 shows a representative 3-bit multilevel cell memory array 250 that interleaves the data from the data buffers 420, 422, and 424. For example, a first multilevel cell stores a voltage in the charge state associated with a memory element bit pattern comprised of bits 0, 0', and 0" from the data buffers 420, 422, and 424, respectively. A subsequent multilevel cell stores a voltage in the charge state associated with a memory element bit pattern comprised of bits 1, 1', and 1" from the data buffers 420, 422, and 424, respectively, and so forth.

For one embodiment, the error correction codes are also interleaved such that a multilevel cell stores a voltage in the charge state associated with a memory element bit pattern comprised of ECC0, ECC0', and ECC0". Another multilevel cell stores a voltage in the charge state associated with a memory element bit pattern comprised of ECC1, ECC1', and ECC1".

FIG. 5 shows that a single error encoder 410 can be used by all three data buffers 420, 422, and 424 to produce the error correction bits for each of the data buffers. Additional multiplexers (not shown) may also be required. Alternatively, a separate error encoder associated with each of the data buffers 420, 422, and 424 could be employed.

Figure 7:
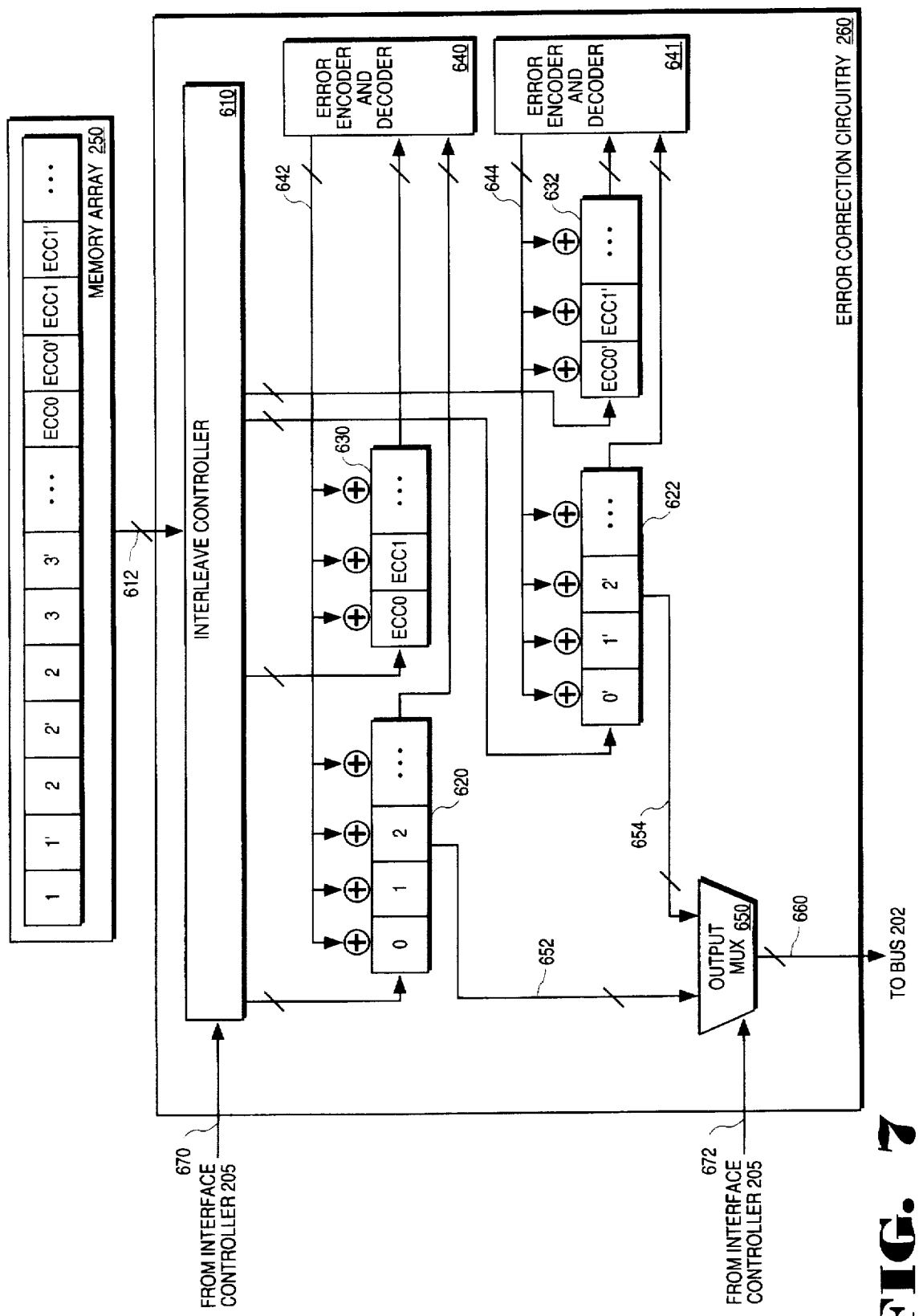
FIG. 7 shows representative decode circuitry within error correction circuitry for reading back data from a 2-bit multilevel cell memory array.

FIG. 7 shows representative decode circuitry within error correction circuitry 260 for reading back data from a 2-bit multilevel cell memory array. An interleave controller (interleavor) 610 receives the 2-bit memory element bit patterns from the memory array 250 via bus 612. The interleave controller 610 is coupled to provide the first bit of each memory element bit pattern to data buffer 620. The interleave controller 610 is coupled to provide the second bit of each memory element bit pattern to data buffer 622.

Similarly, the interleave controller 610 is coupled to provide the first bit of each error code memory element bit pattern to the error code buffer 630, and the interleave controller 610 is coupled to provide the second bit of each error code memory element bit pattern to the error code buffer 632.

The data buffer 620 and the error code buffer 630 are coupled to provide an input to the error encoder and decoder (EED) 640. The data buffer 622 and the error code buffer 632 are coupled to provide an input to the error encoder and decoder (EED) 641. The EED 640 is coupled to provide signals 642 to data buffer 620 and error code buffer 630. The signals 642 are used for modifying the data stored in the data buffer 620. Combinational logic such as XOR gates may be used to implement such a function. Similarly, the EED 641 is coupled to provide signals 644 to data buffer 622 and error code buffer 632. The signals 644 are used for modifying the data stored in the data buffer 622. For one embodiment, the signals 642 are additionally able to modify, or correct, the data stored in the error code buffer 630, and the signals 644 are able to modify the data stored in the error code buffer 632.

The data buffers 620 and 622 are coupled to provide data to an output multiplexer (mux) 650 via buses 652 and 654. The output mux 650 is coupled to provide data to the bus 202 via bus 660.

The interface controller 205 provides signals 670 and 672 to the interleave controller 610 and the output mux 650, respectively. The control signals 670 and 672 are used to synchronize reading of the memory array. The signal 670 to the interleave controller 610 controls the routing of data bits from the interleave controller 610 to the data buffers 620 and 622 and the error code buffers 630 and 632. The control signal 672 controls whether data buffer 620 or data buffer 622 is coupled to the bus 202 via bus 660.

Figure 8:
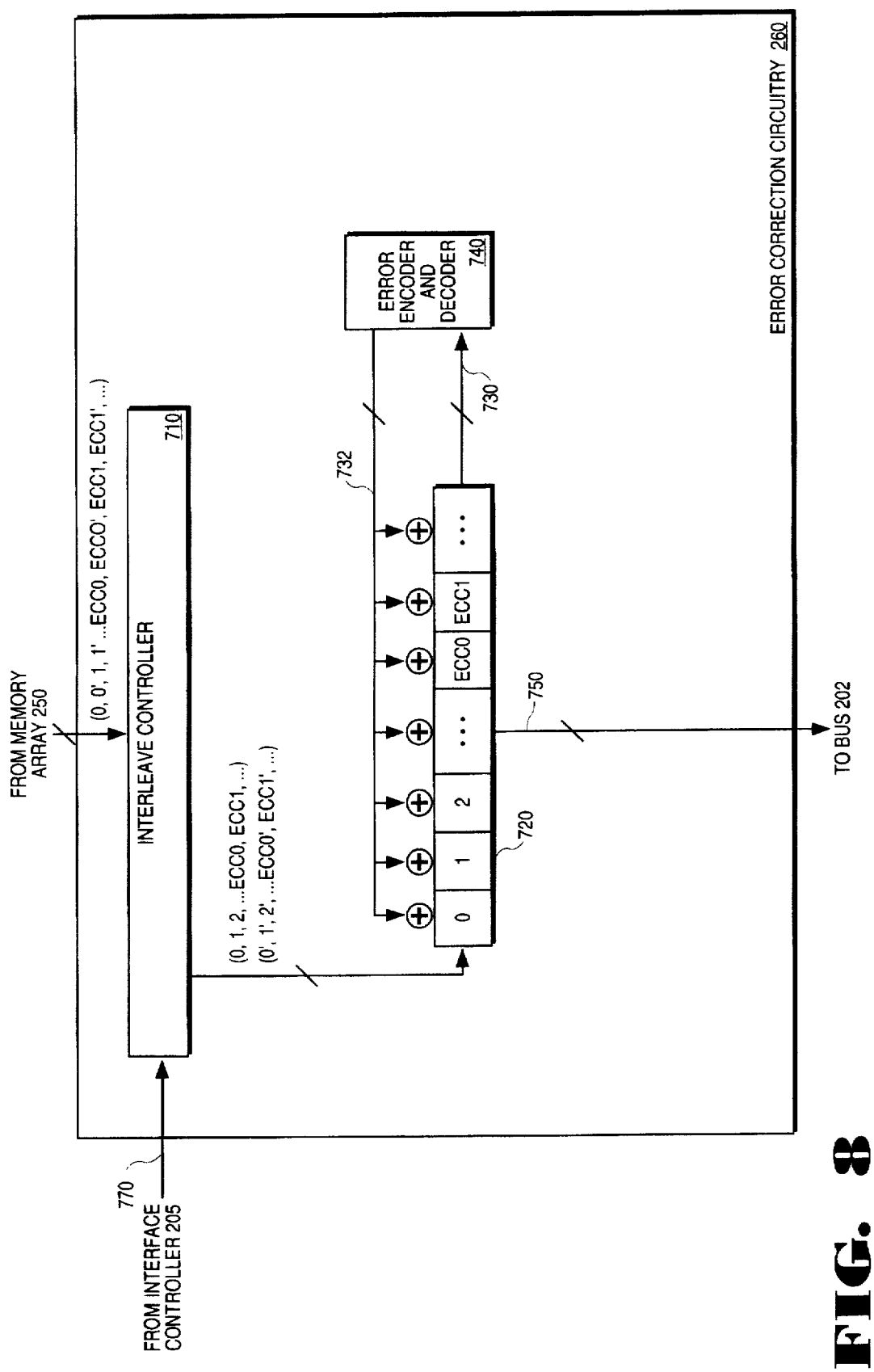
FIG. 8 shows an embodiment of the decoding circuitry of error correction circuitry 260 that uses a single data buffer.

FIG. 8 shows an embodiment of the decoding circuitry of error correction circuitry 260 that uses a single data buffer. In this case, the data is from a 2-bit multilevel cell memory array. The control signal 770 from the interface controller 205 controls the interleave controller 710 for providing data to buffer 720. The control signal 770 signals the interleave controller to return a set of data (0, 1, 2, . . . ECC0, ECC1, . . .) at one point in time. Subsequently, the control signal 770 signals the interleave controller 710 to provide a second set of data (0', 1', 2', . . . , ECC0', ECC1', . . . ). Thus, the embodiment of FIG. 8 uses temporal interleaving so that only one data buffer is required. In an alternate embodiment, the interleave controller 710 can be extended to interleave an N-bit multilevel cell, where N is an integer larger than 1. Additionally, FIG. 8 shows that one buffer 720 can be employed to hold both data bits and error correction code bits; a separate error code buffer need not be employed.

An error encoder and decoder 740 is coupled to receive the data bits and the error correction bits from the buffer 720. The error encoder and decoder 740 provides signals 732 back to the buffer 720 for correcting bits in the buffer 720. The buffer 720 is provided to bus 202 via bus 750.

Figure 9:
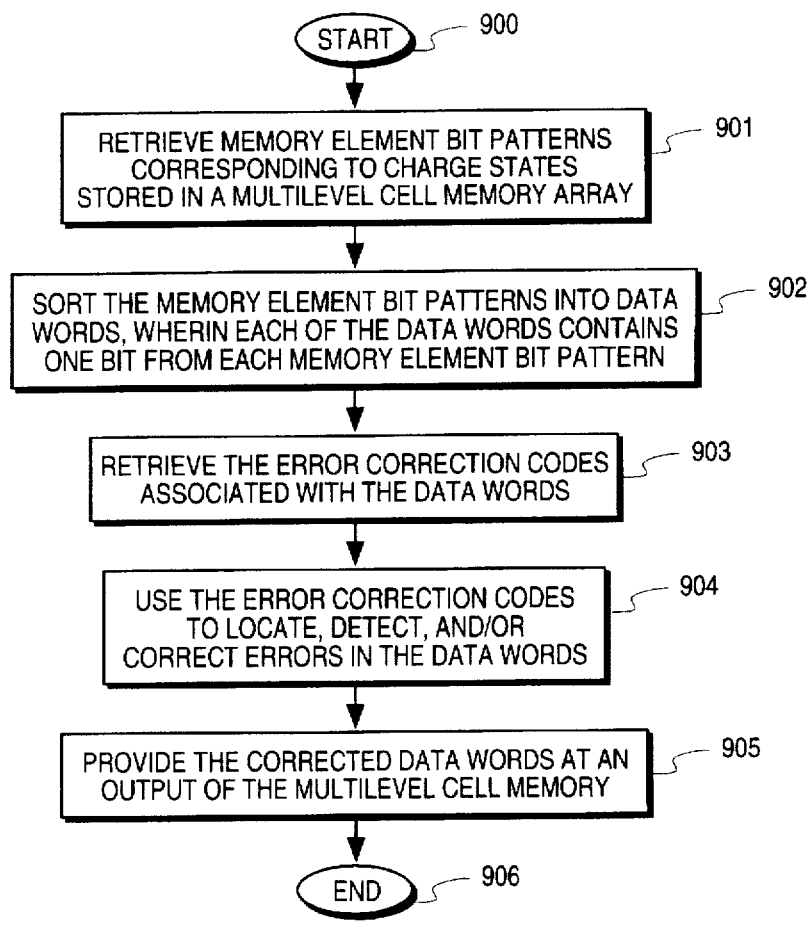
FIG. 9 is a flowchart showing the steps taken in decoding data read from the N-bit multilevel cell memory.

FIG. 9 is a flowchart showing the steps taken in decoding data read from the N-bit multilevel cell memory. The flowchart starts at block 900, from which operation continues at block 901. At block 901 memory element bit patterns are retrieved from the multilevel cell memory array 250. The memory element bit patterns correspond to charge states stored in the multilevel cell memory array 250.

Operation continues at block 902, at which the memory element bit patterns are sorted into N data words. Each of the N data words contains one bit from each memory element bit pattern of the multilevel cell memory array 250.

At block 903, error correction codes associated with each of the data words is retrieved. For one embodiment, the error correction codes are also stored in the multilevel cell memory array 250. The error correction codes are sorted by the interleavor to produce N sets of error correction codes. In an alternate embodiment, the error correction codes are stored in a different memory array, and may or may not be interleaved in a multilevel cell memory array.

Operation continues at block 904, at which the error correction codes are used to locate, detect, and/or correct errors in their associated data words. At block 905, the corrected data words are provided at an output of the multilevel cell memory. If correction is not possible, appropriate error flagging procedures are taken.

Figure 10:
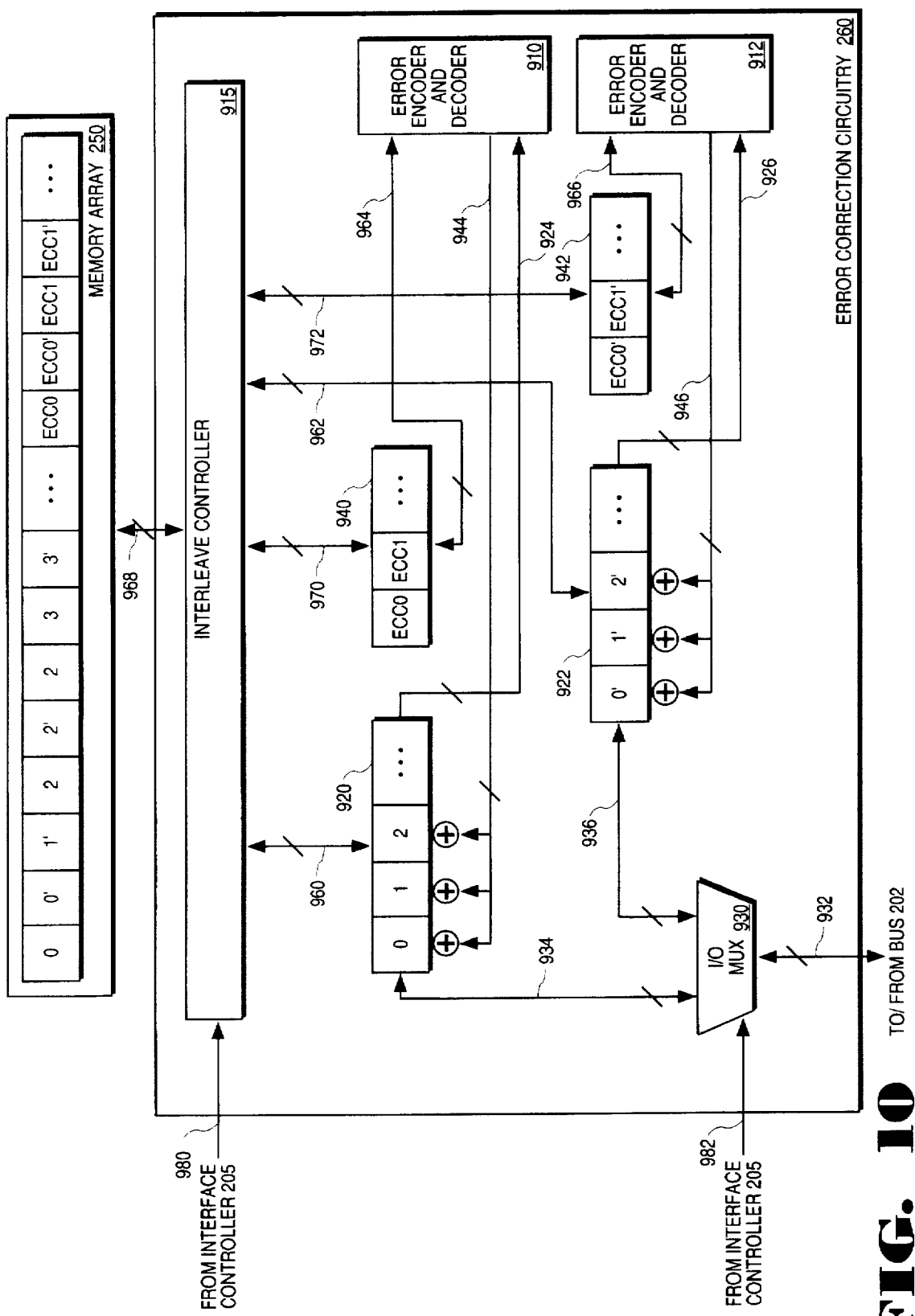
FIG. 10 shows an embodiment of the error correction circuitry 260 that shares circuitry for both encoding and decoding error correction codes.

FIG. 10 shows an embodiment of the error correction circuitry 260 that shares circuitry for both encoding and decoding error correction codes. FIG. 10 shows an example of a 2-bit multilevel cell memory.

An input/output multiplexer (I/O mux) 930 controls whether data buffer 920 or data buffer 922 receives a data input from the bus 202 via bus 932. The I/O mux 930 also controls whether data buffer 920 or data buffer 922 provides data to the bus 202 via bus 932.

The data buffers 920 and 922 are coupled to the error encoder and decoders (EEDs) 910 and 912 via buses 924 and 926, respectively. The data buffers 920 and 922 are used to temporarily hold the data input from the I/O mux 930 so that error correction codes may be generated by the EEDs 910 and 912. The EEDs 910 and 912 are coupled to error code buffers 940 and 942 via buses 964 and 966. The EEDs 910 and 912 provide error correction codes to the error codes buffers 940 and 942.

The data buffers 920 and 922 are coupled to interleave controller 915 via buses 960 and 962. The error code buffers 940 and 942 are coupled to the interleave controller 915 via buses 970 and 972. The interleave controller 915 is also coupled to the memory array 250 via bus 968.

The control signals 980 and 982 are used to synchronize programming and reading of the memory array. For one embodiment, the control signals 980 from the interface controller 205 control whether the memory array 250 provides data to the data buffer 920 and error code buffer 940 or to the data buffer 922 and error code buffer 942. The control signals 980 also controls whether the data buffer 920 and error code buffer 940 or the data buffer 922 and error code buffer 942 provide data to the memory array 250.

For the embodiments previously described, data is corrected prior to being provided out of the memory device onto bus 202. The original data stored in the memory array 250, however, is not corrected. For an alternate embodiment, of a multilevel cell memory, the erroneous multilevel cell (or cells) is updated with the corrected data. The additional complexity in some memory devices, however, makes correction infeasible. For example, for a flash memory embodiment, generally, an entire block would have to be erased in order to rewrite data to a multilevel cell that has previously already been written.

Figure 1:
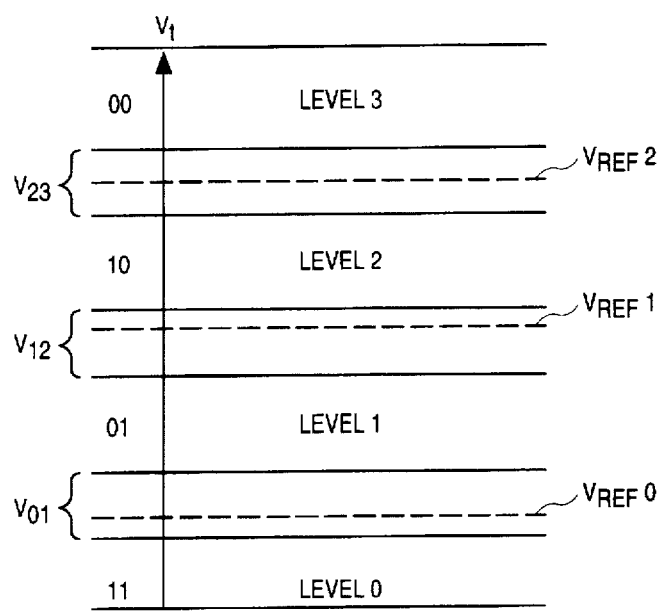
FIG. 1 shows a representation of the charge states that can be stored in a prior art multilevel cell.
Figure 2:
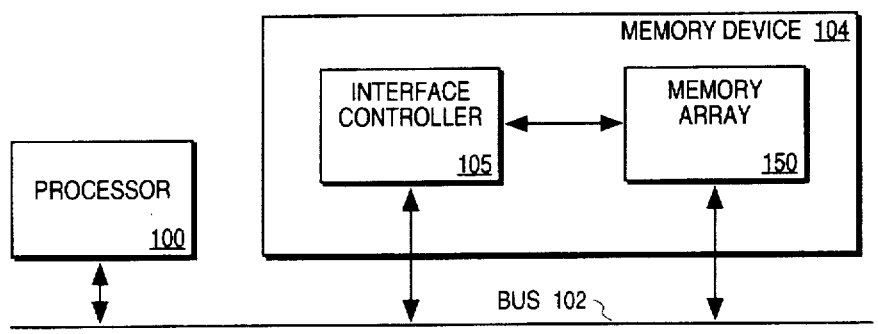
FIG. 2 shows a prior art representation of a processor and multilevel cell memory device.

In a variation on the above described embodiments, the probability of an error in one of the data buffers can be reduced to the point of not checking that data buffer for errors. In one embodiment of this variation, the memory element bit patterns associated with the 2-bit multilevel cell are as shown in FIG. 1 and Table 1, below. The memory element bit patterns are comprised of a first bit, Bit 0, and a second bit, Bit 0'. In reading the charge state maintained in the 2-bit multilevel cell, the voltage stored in the multilevel cell is compared against Vref1. This determines whether Bit 0' is a '0' or a '1'. Subsequently, the voltage stored in the multilevel cell is compared against either Vref2 or Vref0 (dependent upon the outcome of Bit 0') in order to determine whether Bit 0 is a '0' or a '1'.

TABLE 1

|  | BIT 0 | BIT 0' |
| --- | --- | --- |
| LEVEL 3 | 0 | 0 |
| LEVEL 2 | 1 | 0 |
| LEVEL 1 | 0 | 1 |
| LEVEL 0 | 1 | 1 |

For this embodiment, the probability of the 2-bit multilevel cell failing by transitioning from level 2 to level 1 is made very small compared to the probabilities of the transitions from level 3 to level 2 and from level 1 to level 0. For example, this may result if $V_{12}$ is made large compared to $V_{23}$ and $V_{o01}$.

In this case, the probability of Bit '0' failing compared to Bit 0 failing is very small. In another multilevel cell, similarly, the probability of Bit 1' failing compared to Bit 1 failing is very small.

Referring back to FIG. 7, for this embodiment, the data word retrieved into data buffer 622 comprises the second bit of each multilevel cell. Because the second bit of each multilevel cell has a low probability of failure, the error checking on the data word stored in data buffer 622 can be eliminated. Thus, in the FIG. 7, error encoder and decoder 641 can be eliminated. Additionally, error code buffer 632 can be eliminated. The error correction codes for the data word comprised of the second bits need not even be generated in this embodiment.

This variation for reducing errors in certain data words can be extended to other N-bit multilevel cells by reducing the probability of certain transitions between charge states.

Figure 11:
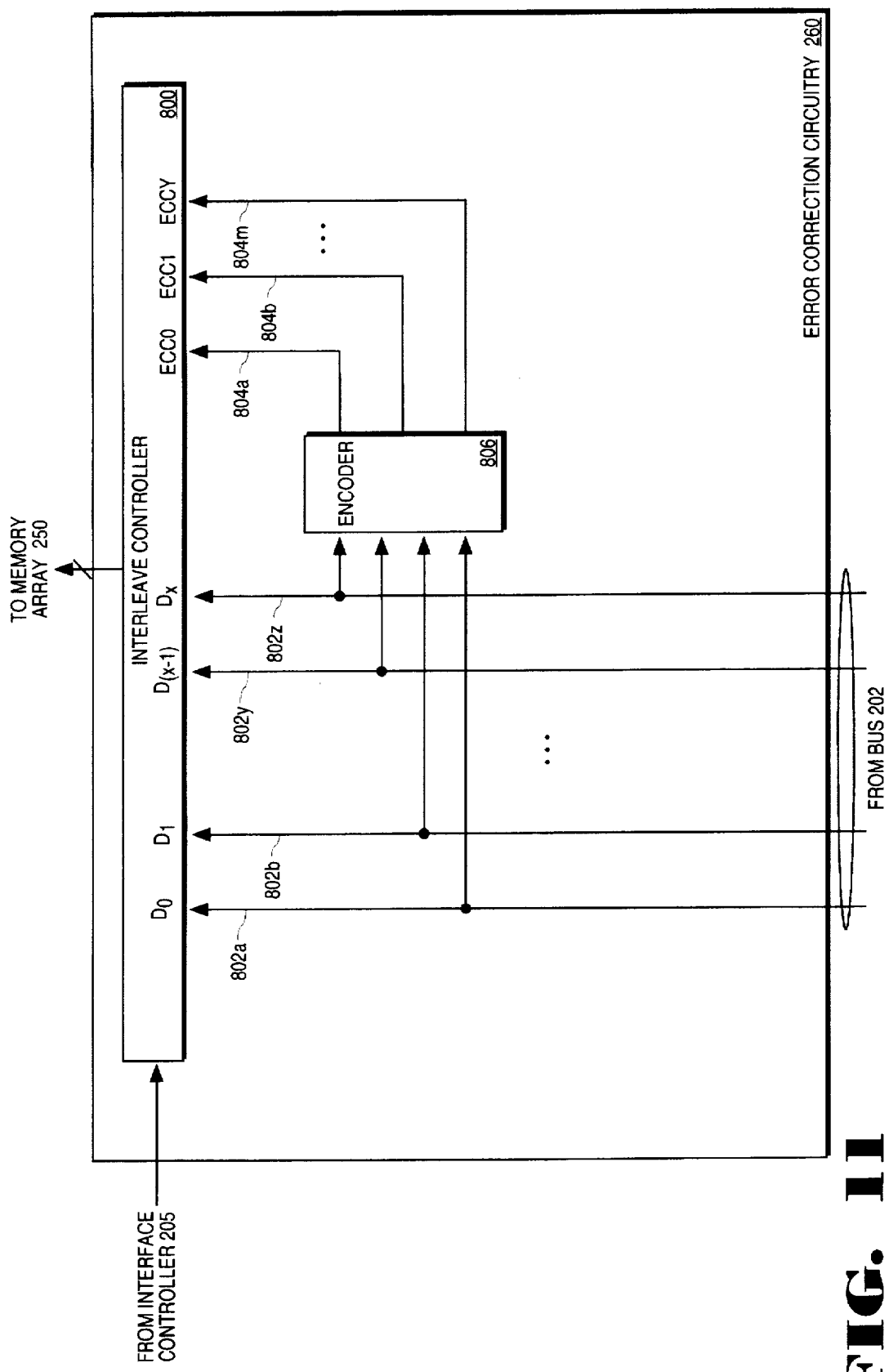
FIGS. 11–13 show embodiments of the error correction circuitry 260 that don't use a data buffer.
Figure 12:
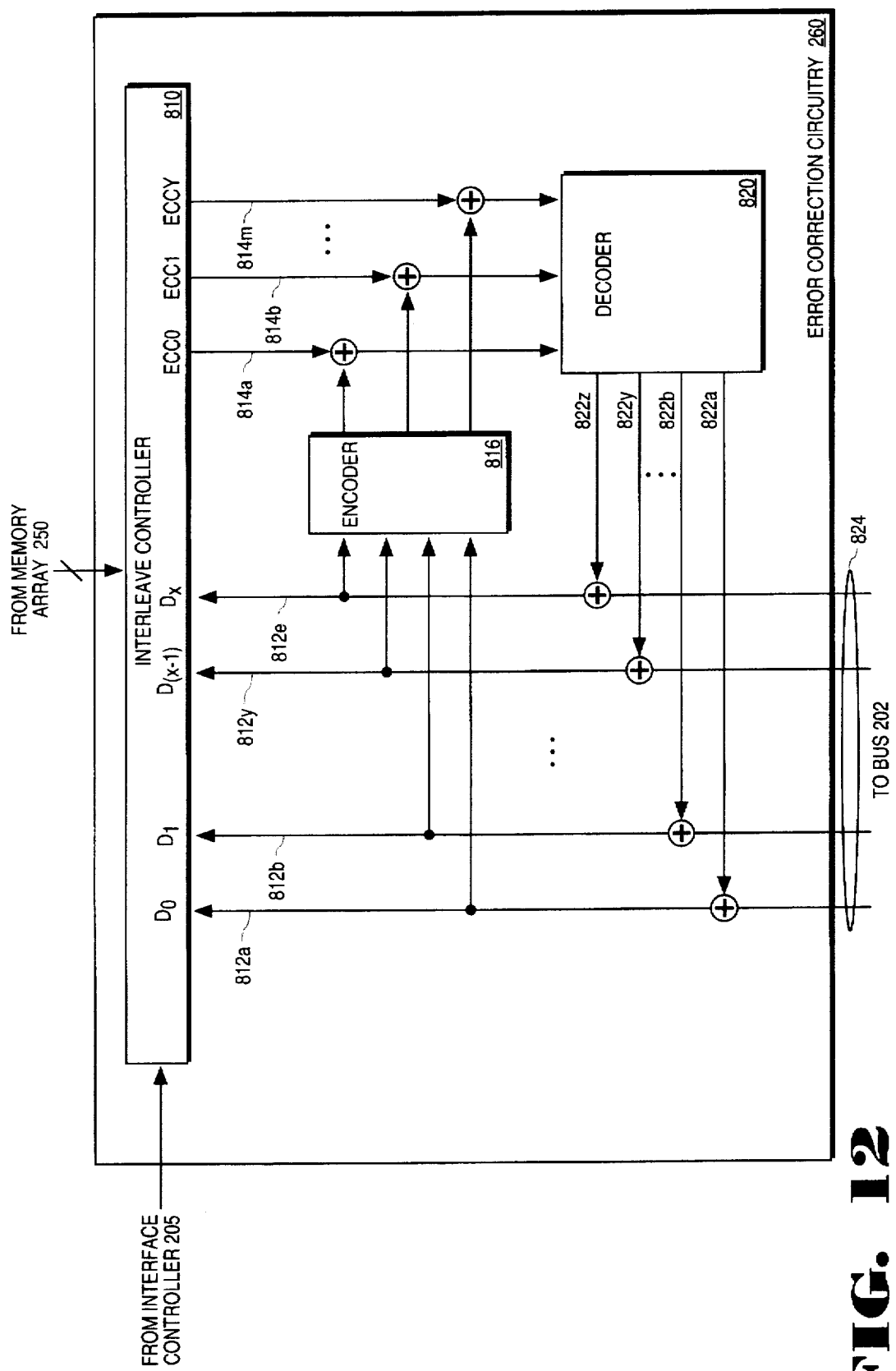
Figure 13:
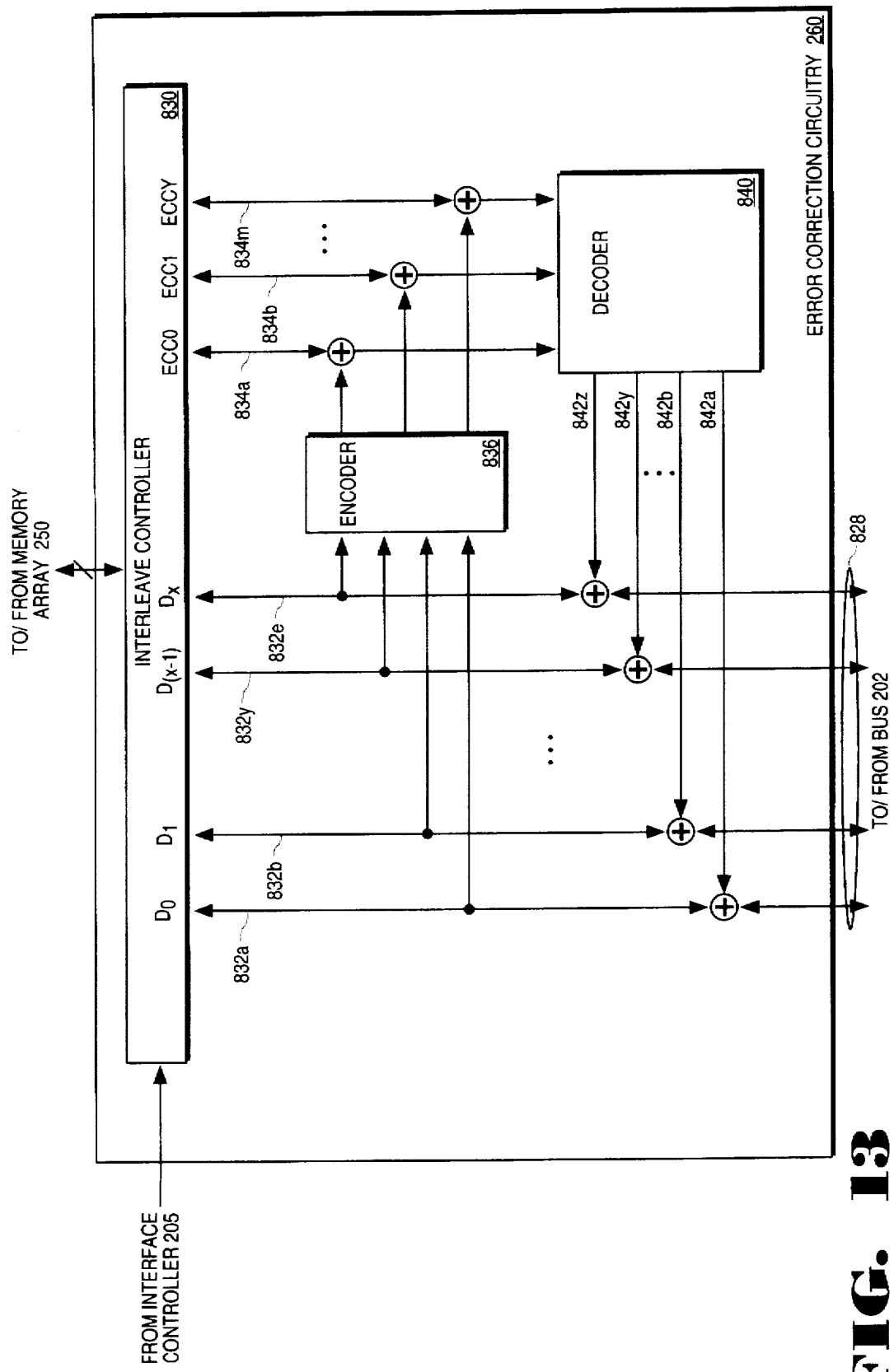

FIGS. 11–13 show embodiments of the error correction circuitry 260 that don't use a data buffer. FIG. 11 shows circuitry for encoding data for storage in the memory array 250. FIG. 12 shows circuitry for decoding data retrieved from the memory array 250. FIG. 13 shows circuitry for both encoding and decoding data to and from the memory array 250.

Referring to FIG. 11, signal lines 802a–z which come from the bus 202 provide data to the interleave controller 800. The signal lines 802a–z are also coupled to an encoder 806 which provides error correction codes on signal lines 804a–m to the interleave controller 800. The interleave controller 800 may wait to receive one or more data word inputs before providing interleaved data to the memory array 250. For one embodiment, the data word inputs are provided sequentially in time. Alternatively, for another embodiment, multiple data words can be written to the interleave controller simultaneously with one or more encoders providing the respective error correction codes to the interleave controller.

FIG. 12 shows circuitry for decoding data retrieved from the memory array 250. The interleave controller 810 temporally interleaves the data bits and the error correction codes from the memory array 250 to provide one set of data bits and error code bits at a time, similar to the circuitry of FIG. 8. There is no buffer in FIG. 12. The data bits are provided on signal lines 812a–z. The error code bits are provided on signal lines 814a–m. The signal lines 812a–z are provided to encoder 816, which re-encodes the data bits to generate error correction codes. The new error correction codes are compared with the signal lines 814a–m, using an XOR function, for example, to provide an input to a decoder 820. The decoder 820 determines whether any of the data bits were incorrectly read from the multilevel cell memory array. If any corrections are to be made, the decoder asserts the appropriate signals, and provides these signals on signal lines 822a–z. The signals 822a–z are XORed with the original signals 812a–z to provide the output signals 824 which are provided to the bus 202.

FIG. 13 shows circuitry for both encoding and decoding data to and from the memory array 250. Signal lines 828 couple the error correction circuitry 260 to the bus 202. Signal lines 832a–z provide data to the interleave controller 830 and the encoder 836. During a program operation, in which data is stored in the memory array 250, the encoder 836 provides error correction codes via signal lines 834a–m to the interleave controller 830. The interleave controller 830 is coupled to provide data to and receive data from the memory array 250.

Upon reading data from the memory array 250, the signal lines 832a–z provide data from the interleave controller 830 to the encoder 836, where the data is re-encoded. The re-encoded error correction codes are compared against the saved error correction codes provided on signal lines 834a–m from the interleave controller 830 using an XOR function, for example. The output of the comparison is provided to the decoder 840. The decoder 840 corrects errors it detects by asserting the appropriate signal line 842a–z which modifies the signal lines 832a–z, via an XOR function, for example, to provide data to the bus 202 via signal lines 828.

In the foregoing specification, the invention has been described with reference to specific exemplary embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of storing data bits in a multilevel cell memory, the multilevel cell memory comprising a plurality of multilevel cells, each of the multilevel cells capable of storing two or more bits of data, the method comprising the steps of:

(a) receiving a plurality of data bits;
   (b) sorting the plurality of data bits into two or more data words;
   (c) generating an error correction code for each of the two or more data words;
   (d) forming a memory element bit pattern comprising one bit from each of the two or more data words;
   (e) storing in one of the plurality of multilevel cells a charge state associated with the memory element bit pattern.

2. The method of claim 1 further comprising the steps of:

(f) repeating the steps (d) and (e) for each of the plurality of data bits of the two or more data words.

3. The method of claim 2 further comprising the steps of:

(g) storing the error correction codes associated with the two or more data words.

4. The method of claim 3 further comprising the steps of:

(h) retrieving the two or more data words from the multilevel cell memory;
   (i) retrieving the error correction codes associated with the two or more data words;
   (j) using the error correction codes to check for errors in the two or more data words.

5. The method of claim 4 further comprising the steps of:

(k) using the error correction codes to correct errors found in the step (1).

6. A method of reading data from a memory comprised of multilevel cells, each of the multilevel cells storing at least two bits of data, the method comprising the steps of:

(a) determining a memory element bit pattern associated with a particular multilevel cell, the memory element bit pattern comprising N data bits;
   (b) storing each of the N data bits into N separate data words;
   (c) repeating steps (a) and (b) for subsequent multilevel cells until each of the N separate data words comprises a predetermined number of bits;
   (d) retrieving N error correction codes, each of which is associated with one of the N separate data words; and
   (e) using each of the N error correction codes to correct errors in its associated N separate data words.

7. A method of checking for errors in a memory, the memory comprising a memory array comprised of memory cells, each of the memory cells capable of storing $2_2N$ charge states, each of the charge states having an associated memory element bit pattern that is N bits wide, wherein N is an integer greater than one, the method comprising the steps of:

(a) retrieving a plurality of memory element bit patterns associated with a plurality of memory cells;
   (b) sorting the plurality of memory element bit patterns into N data words, each of the N data words comprising only a portion, which is less than the entirety, of each of the plurality of memory element bit patterns, wherein a first data word of the N data words has an error correction code associated with it;
   (c) retrieving the error correction code associated with the first data word;
   (d) using the error correction code to check for an error in the first data word.

8. The method of claim 7 wherein the N data words include a second data word, and wherein the second data word is provided at an output of the memory without checking for an error in the second data word.

9. A circuit comprising:

a) a plurality of multilevel cells capable of storing at least two bits of data each;
   b) an interleavor having an interleavor input coupled to accept the data and an interleavor output coupled to provide a first data word and a second data word, the first data word comprised of a first portion of the data and the second data word comprised of a second portion of the data, the first portion of the data comprised of at least one bit from each of a set of multilevel cells, the second portion of the data comprised of at least one bit from each of the set of multilevel cells, the first portion of the data mutually exclusive of the second portion of the data; and
   c) an error circuit coupled to the interleavor output, the error circuit having an error code output.

10. The circuit of claim 9 wherein the error code output is coupled to a buffer capable of storing the first data word.

11. The circuit of claim 10 wherein the error code output is coupled to the buffer to change individual bits being stored in the buffer.

12. The circuit of claim 9 wherein the interleavor output comprises a first interleavor output and a second interleavor output.

13. The circuit of claim 12 wherein the first interleavor output and second interleavor output are stored in data buffers, and the data buffers are coupled as inputs to an output multiplexer that provides an output to a system bus.

14. The circuit of claim 9 wherein the first data word is provided at the interleavor output at a different time than the second data word is provided at the interleavor output.

15. The circuit of claim 9 wherein the error code output and an error correction code associated with the first data word are XORed together to provide an input to a decoder, the decoder having an output coupled back to the first data word.

16. A circuit comprising:

a) an interleavor having an interleavor input coupled to accept a first data word and a second data word, the first data word comprised of a first set of bits, the second data word comprised of a second set of bits, the interleavor providing an interleavor output;
   b) a memory array comprised of multilevel cells capable of storing at least two bits of data each, wherein the memory array is coupled to receive the interleavor output, wherein each of a plurality of multilevel cells stores one bit of the first set of bits and one bit of the second set of bits; and c) an error circuit coupled to accept the first data word, the error circuit providing an error code output.

17. The circuit of claim 16 wherein the error code output is coupled to a second interleavor input of the interleavor.

18. The circuit of claim 17 wherein the error circuit is coupled to accept the second data word, and the error circuit provides a second error code output.

19. The circuit of claim 18 wherein each of a second plurality of multilevel cells stores one bit from the error code output and one bit from the second error code output.

20. The circuit of claim 16 wherein the interleavor accepts the first data word at the interleavor input at a first time, and the interleavor accepts the second data word at the interleavor input at a second time.

21. A multilevel cell memory comprising:

a multilevel cell memory array;

error correction circuitry coupled to receive input data to the multilevel cell memory, the error correction circuitry coupled to provide the input data to the multilevel cell memory array, the error correction circuitry comprising an interleavor coupled to the multilevel cell memory array, an encoder coupled to encode the input data and provide error correction codes to the interleavor; and a decoder coupled to the interleavor for correcting errors read from the multilevel cell memory array.

22. The multilevel cell memory of claim 21 wherein the error correction circuitry further comprises:

a data buffer, the data buffer coupled to hold the input data and coupled to provide the input data to the interleavor.

23. The multilevel cell memory of claim 21 wherein the error correction circuitry further comprises: an error code buffer, the error code buffer coupled to hold the error correction codes and coupled to provide the error correction codes to the interleavor.

* * * * *

UNITED STATES PATENT AND TRADEMARK OFFICE
CERTIFICATE OF CORRECTION

PATENT NO.    : 5,754,566
DATED         : May 19, 1998
INVENTOR(S)   : Mark J. Christopherson et al.

It is certified that error appears in the above-identified patent and that said Letters Patent is hereby corrected as shown below:

Column 1,
Line 34, delete "$V_2$" and insert -- $V_{12}$ --

Column 4,
Line 20, delete "ECCO and ECCO" and insert -- $ECC0$ and $ECC0'$ --

Column 5,
Line 22, delete "ECCO, ECCO', and ECCO'''" and insert -- $ECC0$, $ECC0'$, and $ECC0''$ --

Column 6,
Line 15, delete "ECCO" and insert -- $ECC0$ --

Column 7,
Line 61, delete "$VO_{O1}$" and insert -- $V_{01}$ --

Column 9,
Line 48, delete "(1)" and insert -- (j) --
Line 67, delete "$2_2N$" and insert -- $2^N$ --

Signed and Sealed this

Twenty-third Day of July, 2002

Attest:

Attesting Officer

JAMES E. ROGAN
Director of the United States Patent and Trademark Office